(12) United States Patent
Tang et al.

(10) Patent No.: US 10,234,502 B1
(45) Date of Patent: Mar. 19, 2019

(54) CIRCUIT DEFECT DIAGNOSIS BASED ON SINK CELL FAULT MODELS

(71) Applicant: Mentor Graphics Corporation, Wilsonville, OR (US)

(72) Inventors: Huaxing Tang, Wilsonville, OR (US); Manish Sharma, Wilsonville, OR (US); Robert Brady Benware, Clackamas, OR (US); Wu-Tung Cheng, Lake Oswego, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 82 days.

(21) Appl. No.: 15/454,909

(22) Filed: Mar. 9, 2017

Related U.S. Application Data

(60) Provisional application No. 62/305,722, filed on Mar. 9, 2016.

(51) Int. Cl.
*G01R 31/28* (2006.01)
*G01R 31/317* (2006.01)
*G01R 31/3177* (2006.01)

(52) U.S. Cl.
CPC ... *G01R 31/31704* (2013.01); *G01R 31/3177* (2013.01); *G01R 31/31707* (2013.01)

(58) Field of Classification Search
CPC ........ G01R 31/31723; G01R 31/31704; G01R 31/3177; G01R 31/318555; G01R 31/318594; G01R 31/318547; G01R 31/318536; G06F 17/5045; G06F 17/5072; G06F 2217/84; G06F 2217/14
See application file for complete search history.

(56) References Cited

U.S. PATENT DOCUMENTS

| | | | |
|---|---|---|---|
| 2007/0100586 A1* | 5/2007 | Cheng ............ | G01R 31/318547 702/185 |
| 2007/0226570 A1* | 9/2007 | Zou ................ | G01B 31/318342 714/741 |
| 2013/0024830 A1* | 1/2013 | Tang ................ | G06F 17/5022 716/112 |
| 2013/0145213 A1* | 6/2013 | Tang ................ | G06F 11/26 714/33 |

* cited by examiner

*Primary Examiner* — Guerrier Merant

(57) ABSTRACT

Various aspects of the disclosed technology relate to circuit defect diagnosis based on sink cell fault models. Defect candidates are determined based on path-tracing from failing bits into the circuit design. Based on the defect candidates and one or more conventional fault models, failing test pattern simulations are performed to determine initial defect suspects. Initial defective sink cell suspects are then determined by comparing driving strengths for fan-out cells of the initial defect suspects with driving strengths for corresponding driver cells. Defective sink cell suspects may be identified in the initial defective sink cell suspects based on fault effect propagations and passing test pattern simulations.

20 Claims, 4 Drawing Sheets

CIRCUIT DEFECT DIAGNOSIS BASED ON SINK CELL FAULT MODELS

RELATED APPLICATIONS

This application claims the benefit of U.S. Provisional Patent Application No. 62/305,722, filed on Mar. 9, 2016, entitled "Cell internal bridge defect diagnosis," and naming Huaxing Tang et al. as inventors, which application is incorporated entirely herein by reference.

FIELD OF THE DISCLOSED TECHNIQUES

The presently disclosed techniques relates to the field of circuit testing and defect diagnosis technology. Various implementations of the disclosed techniques may be particularly useful for identifying defective cell suspects.

BACKGROUND OF THE DISCLOSED TECHNIQUES

Traditionally scan diagnosis is used to determine the most likely faulty locations and fault types for a given failing device on scan failures. The diagnosis results guide physical failure analysis (PFA) to locate defects and identify the root cause. Defects are typically classified into two categories based on defect locations. A defect in a library cell is called a cell internal defect and a defect on interconnecting wires is called an interconnect defect. Significant progress has been made in the area of interconnect defect diagnosis. Various fault models are developed to address different fault effects and layout information is incorporated into the diagnosis process. The improved diagnosis accuracy and resolution enable failure analysis engineers to focus on smaller areas, reduce the turnaround time and cost, and improve the PFA success rate. Scan diagnosis has also been applied directly to yield analysis. Volume diagnosis results are analyzed to identify systematic yield limiters.

Efforts have also been made to provide better accuracy and resolution for cell internal defects. In one approach, a transistor-level defect is first mapped into a gate-level defect, and then a conventional gate-level diagnosis tool is applied to the converted gate-level design to identify faulty gates and pinpoint faulty transistors. Another approach is based on excitation condition extraction. Defective cells are first determined by conventional gate-level diagnosis techniques. Then the failing excitation conditions and passing excitation conditions for interested cells are extracted from the test patterns. The failing excitation conditions are the logic value combinations on the inputs of the defective cell that can activate the internal defects and propagate the effects to the cell outputs. The passing excitation conditions are the logic value combinations on the inputs that cannot excite or propagate the internal defect to the cell outputs.

Various techniques have been developed to derive cell internal defect candidates from the extracted excitation condition. In one of such techniques, an excitation condition table for stuck-open faults is correlated with a gate input sequence table to diagnose the cell internal defects with sequence dependent defect behavior. In another one, switch level simulation is first used to create a fault dictionary for cell internal faults, including bridges faults, stuck-at faults and stuck-open faults. Excitation conditions for suspect cells are matched against the pre-generated fault dictionary to come up with the final report.

The excitation condition extraction is, however, a non-trivial task, especially for widely used multi-cycle test patterns. Moreover, while the defective cell may be located, the exact defect location within that cell cannot be determined. Recently, a new cell-aware diagnosis technique based on fault models derived by analog simulation has been developed by the applicant. This new technique can pinpoint the defect location within a cell for various cell internal defects.

Despite the aforementioned developments, conventional diagnosis techniques can still fail to identify some defective cells. In particular, a defective cell can be missed by a conventional diagnosis technique if fault effects do not propagate through the defective cell itself (a sink cell) but through other cells that share the same driver cell with the defective cell (other sink cells) or through all of the sink cells. New fault models and diagnosis processes are needed to address the problem.

BRIEF SUMMARY OF THE DISCLOSED TECHNIQUES

Various aspects of the disclosed technology relate to circuit defect diagnosis based on sink cell fault models. In one aspect, there is a method, executed by at least one processor of a computer, comprising: receiving information of a circuit design, test patterns and test responses obtained by applying the test patterns to test circuits, wherein the circuits are fabricated based on the circuit design and the information of the test responses comprises information of failing bits; determining defect candidates based on path-tracing from the failing bits into the circuit design; performing failing test pattern simulations based on one or more conventional fault models and the defect candidates to determine initial defect suspects; and determining initial defective sink cell suspects by comparing driving strengths for fan-out cells of the initial defect suspects with driving strengths for corresponding driver cells.

The method may further comprise determining defective sink cell suspects in the initial defective sink cell suspects based on fault effect propagations derived from the failing test pattern simulations. The determining defective sink cell suspects may be further based on passing test pattern simulations. The determining defective sink cell suspects may comprise removing from being considered as a defective sink cell suspect each of the initial defective sink cell suspects having a fault effect that propagates through at least one of fellow fan-out cells but not all of the fellow fan-out cells, the fellow fan-out cells being cells sharing a driver cell with the each of the initial defective sink cell suspects.

The driving strength for a cell may be determined based on a number of fan-outs of an output of the cell. The one or more conventional fault models may comprise stuck-at fault models. The one or more conventional fault models may further comprise fault models for cell internal defects.

In another aspect, there are one or more non-transitory computer-readable media storing computer-executable instructions for causing one or more processors to perform the above method.

In still another aspect, there is a system, comprising: one or more processors, the one or more processors programmed to perform the above method.

Certain inventive aspects are set out in the accompanying independent and dependent claims. Features from the dependent claims may be combined with features of the independent claims and with features of other dependent claims as appropriate and not merely as explicitly set out in the claims.

Certain objects and advantages of various inventive aspects have been described herein above. Of course, it is to be understood that not necessarily all such objects or advantages may be achieved in accordance with any particular embodiment of the disclose techniques. Thus, for example, those skilled in the art will recognize that the disclose techniques may be embodied or carried out in a manner that achieves or optimizes one advantage or group of advantages as taught herein without necessarily achieving other objects or advantages as may be taught or suggested herein.

DETAILED DESCRIPTION OF THE DISCLOSED TECHNIQUES

General Considerations

Various aspects of the disclosed technology relate to circuit defect diagnosis based on sink cell fault models. In the following description, numerous details are set forth for the purpose of explanation. However, one of ordinary skill in the art will realize that the disclosed technology may be practiced without the use of these specific details. In other instances, well-known features have not been described in details to avoid obscuring the disclosed technology.

Some of the techniques described herein can be implemented in software instructions stored on a computer-readable medium, software instructions executed on a computer, or some combination of both. Some of the disclosed techniques, for example, can be implemented as part of an electronic design automation (EDA) tool. Such methods can be executed on a single computer or on networked computers.

Although the operations of the disclosed methods are described in a particular sequential order for convenient presentation, it should be understood that this manner of description encompasses rearrangements, unless a particular ordering is required by specific language set forth below. For example, operations described sequentially may in some cases be rearranged or performed concurrently. Moreover, for the sake of simplicity, the disclosed flow charts and block diagrams typically do not show the various ways in which particular methods can be used in conjunction with other methods. Additionally, the detailed description sometimes uses terms like "determine," "perform," and "simulate" to describe the disclosed methods. Such terms are high-level abstractions of the actual operations that are performed. The actual operations that correspond to these terms will vary depending on the particular implementation and are readily discernible by one of ordinary skill in the art.

Also, as used herein, the term "design" is intended to encompass data describing an entire integrated circuit device. This term also is intended to encompass a smaller group of data describing one or more components of an entire device, however, such as a portion of an integrated circuit device.

Illustrative Operating Environment

Figure 1:
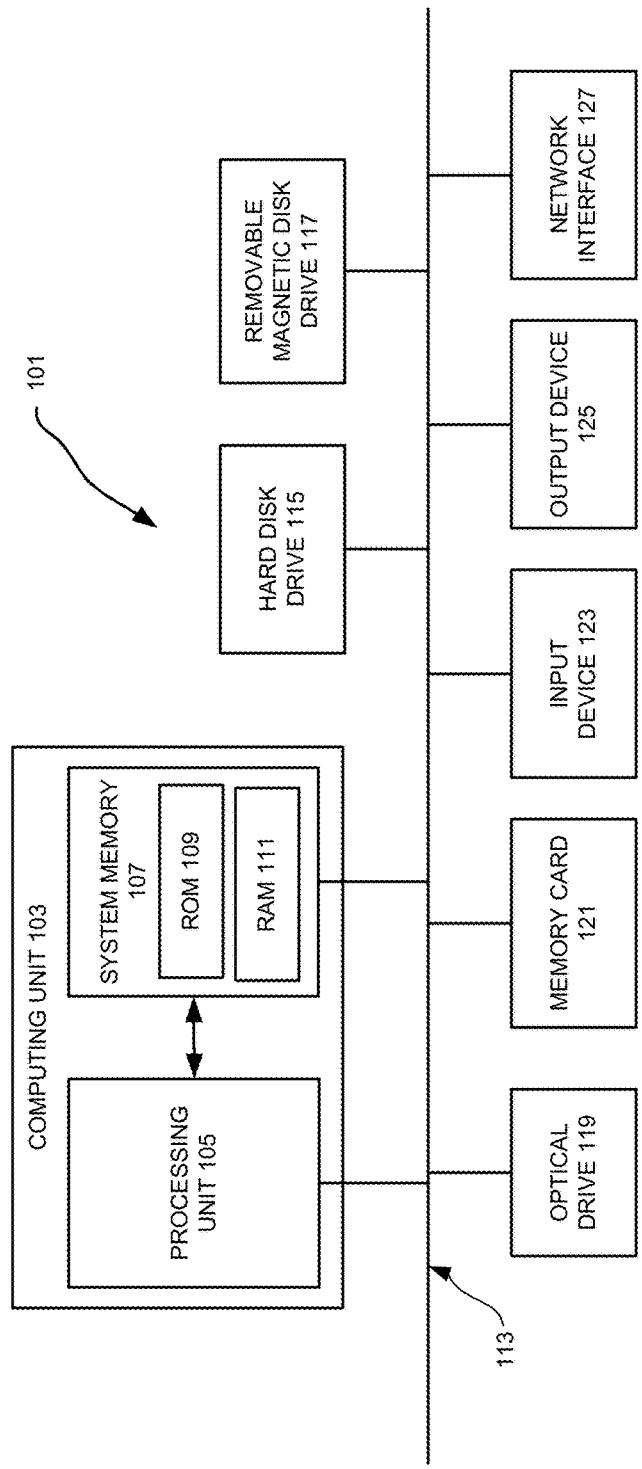
FIG. 1 illustrates a programmable computer system with which various embodiments of the disclosed technology may be employed.

Various examples of the disclosed technology may be implemented through the execution of software instructions by a computing device, such as a programmable computer. Accordingly, FIG. 1 shows an illustrative example of a computing device 101. As seen in this figure, the computing device 101 includes a computing unit 103 with a processing unit 105 and a system memory 107. The processing unit 105 may be any type of programmable electronic device for executing software instructions, but will conventionally be a microprocessor. The system memory 107 may include both a read-only memory (ROM) 109 and a random access memory (RAM) 111. As will be appreciated by those of ordinary skill in the art, both the read-only memory (ROM) 109 and the random access memory (RAM) 111 may store software instructions for execution by the processing unit 105.

The processing unit 105 and the system memory 107 are connected, either directly or indirectly, through a bus 113 or alternate communication structure, to one or more peripheral devices. For example, the processing unit 105 or the system memory 107 may be directly or indirectly connected to one or more additional memory storage devices, such as a "hard" magnetic disk drive 115, a removable magnetic disk drive 117, an optical disk drive 119, or a flash memory card 121. The processing unit 105 and the system memory 107 also may be directly or indirectly connected to one or more input devices 123 and one or more output devices 125. The input devices 123 may include, for example, a keyboard, a pointing device (such as a mouse, touchpad, stylus, trackball, or joystick), a scanner, a camera, and a microphone. The output devices 125 may include, for example, a monitor display, a printer and speakers. With various examples of the computer 101, one or more of the peripheral devices 115-125 may be internally housed with the computing unit 103. Alternately, one or more of the peripheral devices 115-125 may be external to the housing for the computing unit 103 and connected to the bus 113 through, for example, a Universal Serial Bus (USB) connection.

With some implementations, the computing unit 103 may be directly or indirectly connected to one or more network interfaces 127 for communicating with other devices making up a network. The network interface 127 translates data and control signals from the computing unit 103 into network messages according to one or more communication protocols, such as the transmission control protocol (TCP) and the Internet protocol (IP). Also, the interface 127 may employ any suitable connection agent (or combination of agents) for connecting to a network, including, for example, a wireless transceiver, a modem, or an Ethernet connection. Such network interfaces and protocols are well known in the art, and thus will not be discussed here in more detail.

It should be appreciated that the computer 101 is illustrated as an example only, and it not intended to be limiting. Various embodiments of the disclosed technology may be implemented using one or more computing devices that include the components of the computer 101 illustrated in FIG. 1, which include only a subset of the components illustrated in FIG. 1, or which include an alternate combination of components, including components that are not shown in FIG. 1. For example, various embodiments of the disclosed technology may be implemented using a multiprocessor computer, a plurality of single and/or multiprocessor computers arranged into a network, or some combination of both.

Sink Cell Fault Models

Figure 2:
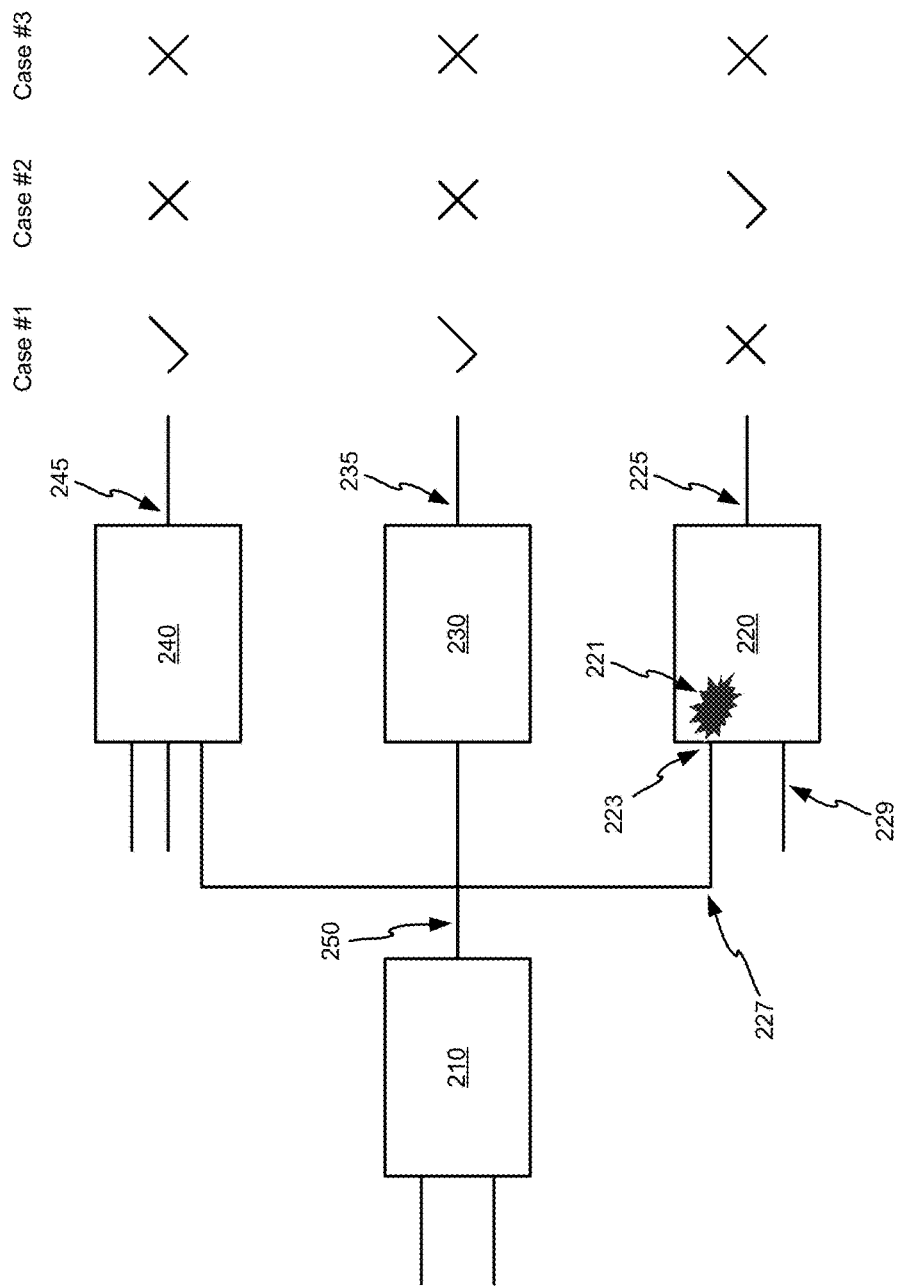
FIG. 2 illustrates circuit having a driver cell and three sink cells.

FIG. 2 illustrates a circuit having a driver cell (210) and multiple sink cells (220-240). A cell is an abstract representation of a component within a schematic diagram or physical layout of an electronic circuit. In designing application-specific integrated circuits (ASICs) with mostly digital-logic features, a standard cell library is usually used. The standard cell library comprises pre-defined digital building blocks—standard cells. A standard cell is a group of transistor and interconnect structures that provides a boolean logic function (e.g., AND, OR, XOR, XNOR, inverters) or a storage function (flip-flop or latch). These standard cells have optimized layouts and are fully characterized for performance. They typically are of a fixed height, enabling them to be placed in rows and thus easing the process of automated digital layout. Standard cell libraries provide identical functional cells between process nodes, or between different process technologies, making cell-based circuits more scalable and portable. In the present disclosure, a standard cell is referred to as a cell.

A cell A is referred to as a driver cell and a cell B is referred to as a sink cell if an output of the cell A is connected to an input of the cell B. In FIG. 2, the output of the cell 210 is coupled to an input of each of the cells 220, 230 and 240. Thus, the cell 210 is a driver cell and the cells 220, 230 and 240 are sink cells of the cell 210. The cells 220 and 240 have additional inputs and thus may be sink cells of other driver cells.

In FIG. 2, the cell 220 is defective as indicated by a defect 221 associated with the input 223. This defect can cause some fault propagation effects leading to inadequate or inaccurate defect diagnosis results. Three fault effect propagation scenarios are illustrated in the figure. In case #1, a fault effect caused by the defect 221 propagates only through the cell 220 to its output 225. Neither the output 235 of the cell 230 nor the output 245 of the cell 240 shows any fault effect. In case #2, a fault effect caused by the defect 221 propagates through both the cells 230 and 240 to their outputs 235 and 245, respectively whereas the output 225 shows no fault effect. In case #3, a fault effect caused by the defect 221 propagates through all of the three cells 220, 230 and 240 to their respective outputs.

Among the three cases, only the case #1 may be diagnosed correctly using a conventional fault model. For example, a stuck-at fault at a net segment 227 may be used to explain the fault effect at the output 225 and no fault effect at the outputs 235 and 245. This can lead to the identification of the cell 220 and the net segment 227 as defect suspects. For the other two cases, especially the case #3, however, a conventional fault model would probably determine that a net segment 250 and the cell 210 are defect suspects. As such, the real defective cell 220 is missed.

The fault effect propagations of cases #2 and #3 may be explained by sink cell fault models. A sink cell fault is a fault associated with a sink cell. The defect in the sink cell can have an effect on the output of the corresponding driver cell that is big enough to cause a fault effect to appear on outputs of other sink cells of the driver cell. For example, assume that the cell 220 in FIG. 2 has a bridge defect driving the input port 223 to ground. If the bridge can absorb current large enough to pull the voltage of the net segment 250 to zero or close to zero, the fault effect propagates through the cells 230 and 240. The fault effect may not be able to reach the output 225 of the defective cell 220 due to the signal at the other input 229 of the cell 220 or the cell internal circuitry, which can cause the case #2 rather than the case #3 to be observed.

Not every sink cell can cause a fault effect to propagate through its fellow sink cells. The relative driving strength between a sink cell and its driver cell may be employed to determine whether the sink cell should be identified as a defect suspect. Various methods can be used to determine the driving strength of a cell. In one method, the number of fan-outs of an output of a cell is used to estimate the driving strength of the cell. In another method, the layout information of the driven net, e.g. net length, topology et al. may be basis for determining the driving strength. In still another method, the driving strength may be determined based on the transistors connected to the output port of the cell.

It should be noted that the circuit shown in FIG. 2 is just an example, which is employed to describe sink cell fault models. Sink cell fault models can be applied to circuitry having a driver cell along with two or more sink cells and each of the sink cells can have one or more inputs.

Circuit Defect Diagnosis Tool

Figure 3:
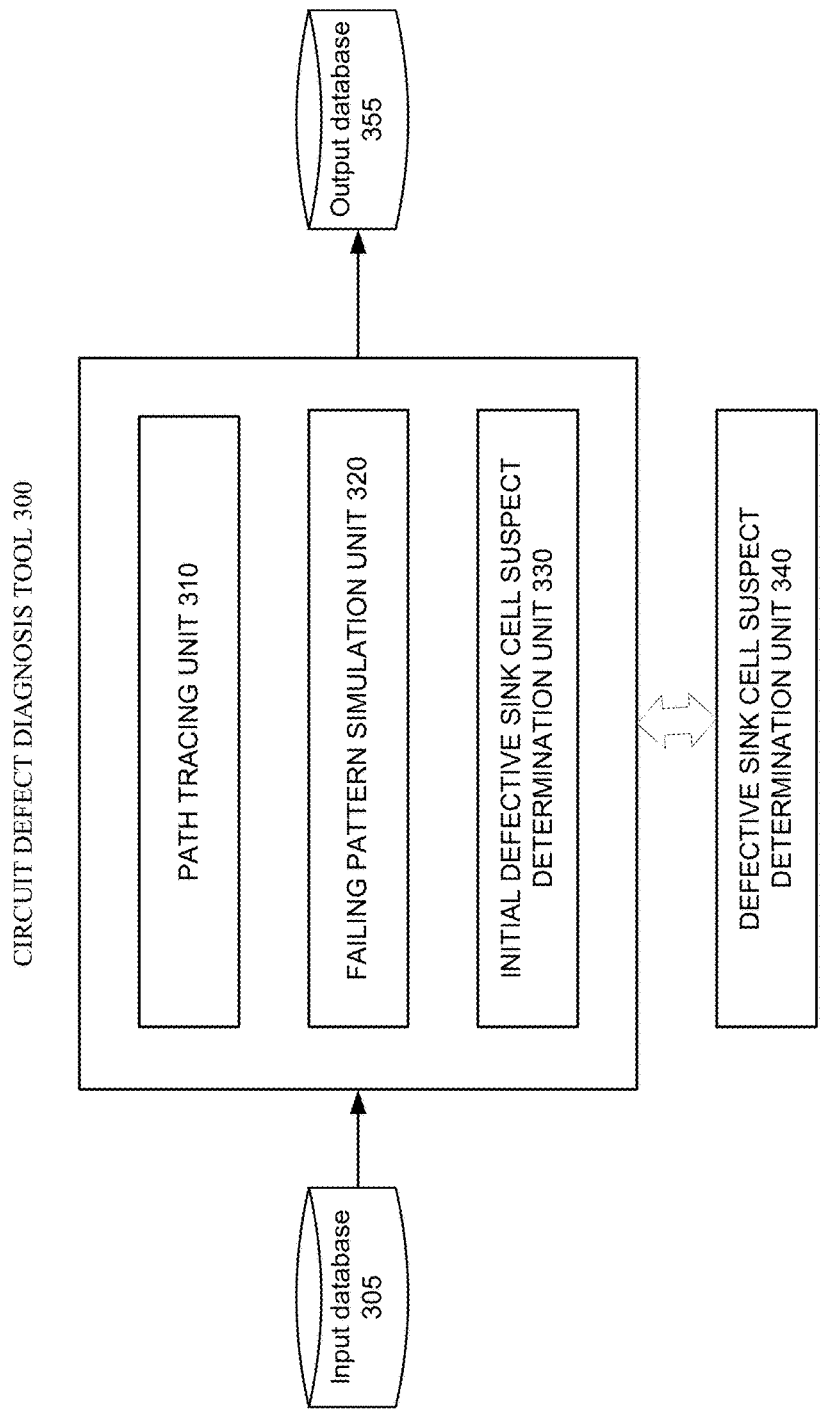
FIG. 3 illustrates a circuit defect diagnosis tool according to various embodiments of the disclosed technology

FIG. 3 illustrates an example of a circuit defect diagnosis tool 300 that may be implemented according to various embodiments of the disclosed technology. As seen in this figure, the circuit defect diagnosis tool 300 includes a path tracing unit 310, a failing pattern simulation unit 320 and an initial defective sink cell suspect determination unit 330. Some implementations of the circuit defect diagnosis tool 300 may cooperate with (or incorporate) one or more of a defective sink cell suspect determination unit 340, an input database 305 and an output database 355.

As will be discussed in more detail below, the circuit defect diagnosis tool 300 receives information of a circuit design, test patterns and test responses that are stored in the database 305. The information of the test responses are obtained by applying the test patterns to circuits fabricated based on the circuit design. The information of the test responses comprises information of failing bits. The path tracing unit 310 performs path-tracing from the failing bits into the circuit design to determine defect candidates. The failing pattern simulation unit 320 performs failing test pattern simulations based on one or more conventional fault models and the defect candidates to determine initial defect suspects. The initial defective sink cell suspect determination unit 330 identifies fan-out cells of the initial defect suspects and determines initial defective sink cell suspects by comparing driving strengths of the fan-out cells with corresponding driver cells. The defective sink cell suspect determination unit 340 may additionally determine defective sink cell suspects in the initial defective sink cell suspects based on fault effect propagations derived from the failing test pattern simulations and performing passing test pattern simulations. The circuit defect diagnosis tool 300 may store the initial defective sink cell suspects, the defective sink cell suspects, or both in the output database 355.

As previously noted, various examples of the disclosed technology may be implemented by one or more computing systems, such as the computing system illustrated in FIG. 1. Accordingly, one or more of the path tracing unit 310, the failing pattern simulation unit 320, the initial defective sink cell suspect determination unit 330 and the defective sink cell suspect determination unit 340 may be implemented by executing programming instructions on one or more processors in one or more computing systems, such as the computing system illustrated in FIG. 1. Correspondingly, some other embodiments of the disclosed technology may be implemented by software instructions, stored on a non-transitory computer-readable medium, for instructing one or more programmable computers/computer systems to perform the functions of one or more of the path tracing unit 310, the failing pattern simulation unit 320, the initial defective sink cell suspect determination unit 330 and the defective sink cell suspect determination unit 340. As used herein, the term "non-transitory computer-readable medium" refers to computer-readable medium that are capable of storing data for future retrieval, and not propagating electro-magnetic waves. The non-transitory computer-readable medium may be, for example, a magnetic storage device, an optical storage device, or a solid state storage device.

It also should be appreciated that, while the path tracing unit 310, the failing pattern simulation unit 320, the initial defective sink cell suspect determination unit 330 and the defective sink cell suspect determination unit 340 are shown as separate units in FIG. 3, a single computer (or a single processor within a master computer) or a single computer system may be used to implement all of these units at different times, or components of these units at different times.

With various examples of the disclosed technology, the input database 305 and the output database 355 may be implemented using any suitable computer readable storage device. That is, either of the input database 305 and the output database 355 may be implemented using any combination of computer readable storage devices including, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable storage devices may also include magnetic cassettes, magnetic tapes, magnetic disks or other magnetic storage devices, holographic storage devices, or any other non-transitory storage medium that can be used to store desired information. While the input database 305 and the output database 355 are shown as separate units in FIG. 3, a single data storage medium may be used to implement some or all of these databases.

Applying Sink Cell Fault Models to Diagnose Cell Internal Defects

Figure 4:
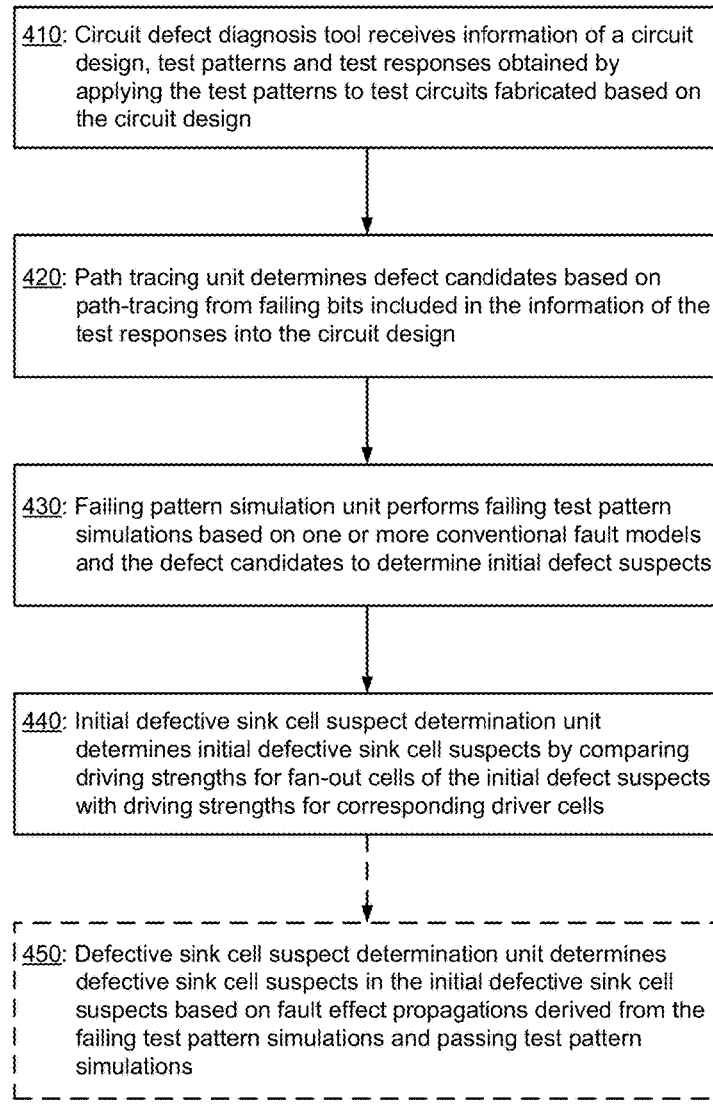
FIG. 4 illustrates a flowchart showing a process of circuit defect diagnosis based on sink cell fault models that may be implemented according to various examples of the disclosed technology.

FIG. 4 illustrates a flowchart 400 showing a process of cell internal defect diagnosis using sink cell fault models that may be implemented according to various examples of the disclosed technology. For ease of understanding, methods of cell internal defect diagnosis using sink cell fault models that may be employed according to various embodiments of the disclosed technology will be described with reference to the circuit defect diagnosis tool 300 illustrated in FIG. 3 and the flow chart 400 in FIG. 4. It should be appreciated, however, that alternate implementations of a circuit defect diagnosis tool may be used to perform the method of cell internal defect diagnosis using sink cell fault models in the flow chart 400 according to various embodiments of the disclosed technology. In addition, it should be appreciated that implementations of the circuit defect diagnosis tool 300 may be employed to implement methods of cell internal defect diagnosis using sink cell fault models according to different embodiments of the disclosed technology other than the one illustrated by the flow chart 400 in FIG. 4.

In operation 410, the circuit defect diagnosis tool 300 receives information of a circuit design, test patterns and test responses that are stored in the database 305. The information of the test responses are obtained by applying the test patterns to test circuits fabricated based on the circuit design. The information of the test responses comprises information of failing bits. The test patterns may comprise test patterns generated by an automatic test pattern generation (ATPG) process. Additionally or alternatively, the test patterns may comprise test patterns generated for special purposes such as diagnosis. The test patterns are typically applied to circuits (fabricated chips or dies) by a tester such as automatic test equipment (ATE). After applying the test patterns, the tester will collect the information of the test responses captured by scan cells in the circuits. Primary outputs may also be used to capture test responses. One or more bits captured in some scan cells/primary outputs for a test pattern may be different from the ones expected for a fault-free circuit and are called failing bits. The information of the failing bits are typically saved in a failure file. For a circuit having a defect, not all of the test patterns can generate failing bits. Those generating failing bits are usually referred to as failing test patterns while those generating no failing bits are usually referred to as passing test patterns.

In operation 420, the path tracing unit 310 determines defect candidates based on path-tracing from the failing bits into the circuit design. The path-tracing comprises probing from the scan cells/primary outputs that capture the failing bits into the circuit design. The backward path tracing traces along the sensitized paths obtained based on the good-circuit simulation results of the test patterns. The sensitized paths originated from a failing bit form a "cone". Cones for the failing bits of one test pattern may be processed such as determining intersection, union et al. to identify the defect candidate. The path tracing unit 310 can employ a commercial fault diagnosis tool to perform the path-tracing operation. An example of such an electronic design automation tool is the Tessent® Diagnosis software tool available from Mentor Graphics Corporation of Wilsonville, Oreg.

In operation 430, the failing pattern simulation unit 320 performs failing test pattern simulations based on one or more conventional fault models and the defect candidates to determine initial defect suspects. The conventional fault models may comprise stuck-at fault models. The conventional fault models may further comprise fault models for cell internal defects. In the operation, the failing pattern simulation unit 320 may inject a stuck-at fault at the location of one of the defect candidates and simulate the failing test patterns to derive simulated test responses. The simulated test responses are then compared with the observed test responses. When matched, the defect candidate may be designated as an initial defect suspect. Again, the failing pattern simulation unit 320 may employ a commercial fault diagnosis tool to perform the failing test pattern operation.

In operation 440, the initial defective sink cell suspect determination unit 330 determines initial defective sink cell suspects by comparing driving strengths for fan-out cells of the initial defect suspects with driving strengths for corresponding driver cells. The circuit example shown in FIG. 2 will be used to explain how the operation 440 may be performed.

For the cases #2 and #3, the initial defect suspect may be the interconnect segment 250, the cell 210, or both based on a stuck-at fault model. The corresponding fan-out cells are the cells 220, 230 and 240. Accordingly, the initial defective sink cell suspect determination unit 330 compares the driving strengths for the sink cells 220, 230 and 240 with the driving strength for the driver cell 210. With various implementations of the disclosed technology, the sink cells having driving strength values greater than or comparable to (e.g., within 95%) the driver cell may be designated as initial defective sink cell suspects. As discussed previously, the driving strength of a cell may be determined using different methods. A simple method is to use the number of fan-outs of an output of a cell as a measure of the driving strength.

Optionally, in operation 450, the defective sink cell suspect determination unit 340 determines defective sink cell suspects in the initial defective sink cell suspects based on fault effect propagations derived from the failing test pattern simulations. Some fault effect propagation scenarios are not illustrated in FIG. 2. Those in which either the output 235 or the output 245 does not show the fault effect cannot be explained by a sink cell fault model. Thus, the defective sink cell suspect determination unit 340 may remove some of the initial defective sink cell from being considered as the defective sink cell suspects if each of them has a fault effect that propagates through at least one of fellow fan-out cells but not all of the fellow fan-out cells. The fellow fan-out cells are cells sharing a driver cell with the initial defective sink cell suspect of interest.

The defective sink cell suspect determination unit 340 may determine defective sink cell suspects in the initial defective sink cell suspects further based on passing test pattern simulations. For an initial defective sink cell suspect, the test patterns that generate no failing bit are simulated with the injection of the sink cell fault. If the simulation results do not match the observation, the initial defective sink cell suspect may be removed from being considered as a defective sink cell suspect. The defective sink cell suspect determination unit 340 may employ additional methods/conditions to determine defective sink cell suspects in the initial defective sink cell suspects.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the disclosed technology. Rather, the scope of the disclosed technology is defined by the following claims and their equivalents. We therefore claim as our disclosed technology all that comes within the scope and spirit of these claims.

What is claimed is:

1. A method, executed by at least one processor of a computer, comprising:
    applying test patterns to test circuits that are fabricated based on a circuit design, by the at least one processor, to obtain test responses, wherein information of the test responses comprises information of failing bits;
    determining defect candidates, by the at least one processor, based on path-tracing from the failing bits into the circuit design;
    performing failing test pattern simulations, by the at least one processor, based on one or more conventional fault models and the defect candidates to determine initial defect suspects;
    determining initial defective sink cell suspects, by the at least one processor, by comparing driving strengths for fan-out cells of the initial defect suspects with driving strengths for corresponding driver cells;
    storing the initial defective sink cell suspects in an output database by the at least one processor.

2. The method recited in claim 1, wherein the one or more conventional fault models comprise stuck-at fault models.

3. The method recited in claim 2, wherein the one or more conventional fault models further comprise fault models for cell internal defects.

4. The method recited in claim 1, further comprising:
    determining defective sink cell suspects in the initial defective sink cell suspects based on fault effect propagations derived from the failing test pattern simulations, and storing the defective sink cell suspects in the output database [0035].

5. The method recited in claim 4, wherein the determining defective sink cell suspects is further based on passing test pattern simulations.

6. The method recited in claim 4, wherein the determining defective sink cell suspects comprises:
    removing from being considered as a defective sink cell suspect each of the initial defective sink cell suspects having a fault effect that propagates through at least one of fellow fan-out cells but not all of the fellow fan-out cells, the fellow fan-out cells being cells sharing a driver cell with the each of the initial defective sink cell suspects.

7. The method recited in claim 1, wherein the driving strength for a cell is determined based on a number of fan-outs of an output of the cell.

8. One or more non-transitory computer-readable media storing computer-executable instructions for causing one or more processors to perform a method, the method comprising:
    applying test patterns to test circuits that are fabricated based on a circuit design, to obtain test responses, wherein information of the test responses comprises information of failing bits;
    determining defect candidates based on path-tracing from the failing bits into the circuit design;
    performing failing test pattern simulations based on one or more conventional fault models and the defect candidates to determine initial defect suspects;
    determining initial defective sink cell suspects by comparing driving strengths for fan-out cells of the initial defect suspects with driving strengths for corresponding driver cells;
    storing the initial defective sink cell suspects in an output database.

9. The one or more non-transitory computer-readable media recited in claim 8, wherein the one or more conventional fault models comprise stuck-at fault models.

10. The one or more non-transitory computer-readable media recited in claim 9, wherein the one or more conventional fault models further comprise fault models for cell internal defects.

11. The one or more non-transitory computer-readable media recited in claim 8, wherein the method further comprises:
    determining defective sink cell suspects in the initial defective sink cell suspects based on fault effect propagations derived from the failing test pattern simulations, and storing the defective sink cell suspects in the output database.

12. The one or more non-transitory computer-readable media recited in claim 11, wherein the determining defective sink cell suspects is further based on passing test pattern simulations.

13. The one or more non-transitory computer-readable media recited in claim 11, wherein the determining defective sink cell suspects comprises:
    removing from being considered as a defective sink cell suspect each of the initial defective sink cell suspects having a fault effect that propagates through at least one of fellow fan-out cells but not all of the fellow fan-out cells, the fellow fan-out cells being cells sharing a driver cell with the each of the initial defective sink cell suspects.

14. The one or more non-transitory computer-readable media recited in claim 8, wherein the driving strength for a cell is determined based on a number of fan-outs of an output of the cell.

15. A system, comprising:
one or more processors, the one or more processors programmed to perform a method, the method comprising:
applying test patterns to test circuits that are fabricated based on a circuit design, to obtain test responses, wherein information of the test responses comprises information of failing bits;
determining defect candidates based on path-tracing from the failing bits into the circuit design;
performing failing test pattern simulations based on one or more conventional fault models and the defect candidates to determine initial defect suspects;
determining initial defective sink cell suspects by comparing driving strengths for fan-out cells of the initial defect suspects with driving strengths for corresponding driver cells;
storing the initial defective sink cell suspects in an output database.

16. The system recited in claim 15, wherein the one or more conventional fault models comprise stuck-at fault models.

17. The system recited in claim 15, wherein the method further comprises:
determining defective sink cell suspects in the initial defective sink cell suspects based on fault effect propagations derived from the failing test pattern simulations, and storing the defective sink cell suspects in the output database.

18. The system in claim 17, wherein the determining defective sink cell suspects is further based on passing test pattern simulations.

19. The system in claim 17, wherein the determining defective sink cell suspects comprises:
removing from being considered as a defective sink cell suspect each of the initial defective sink cell suspects having a fault effect that propagates through at least one of fellow fan-out cells but not all of the fellow fan-out cells, the fellow fan-out cells being cells sharing a driver cell with the each of the initial defective sink cell suspects.

20. The system in claim 15, wherein the driving strength for a cell is determined based on a number of fan-outs of an output of the cell.

* * * * *